(12) United States Patent
Krotov et al.

(10) Patent No.: US 6,758,591 B1
(45) Date of Patent: Jul. 6, 2004

(54) MIXING OF MATERIALS IN AN INTEGRATED CIRCUIT MANUFACTURING EQUIPMENT

(75) Inventors: Peter Krotov, San Jose, CA (US); Colin F. Smith, Half Moon Bay, CA (US); Randy Hall, Santra Cruz, CA (US); Sooyun Joh, Livermore, CA (US)

(73) Assignee: Novellus Systems, Inc., San Jose, CA (US)

( * ) Notice: Subject to any disclaimer, the term of this patent is extended or adjusted under 35 U.S.C. 154(b) by 140 days.

(21) Appl. No.: 10/104,710

(22) Filed: Mar. 22, 2002

(51) Int. Cl.[7] .............................................. B01F 13/02
(52) U.S. Cl. ................ 366/101; 156/345.33; 261/79.2; 366/165.1; 366/165.2
(58) Field of Search .......................... 366/165.1, 165.2, 366/184, 101; 261/79.2; 118/715, 723 MP; 156/345.33, 345.34

(56) References Cited

U.S. PATENT DOCUMENTS

| | | | |
|---|---|---|---|
| 1,520,938 A | * 12/1924 | Cuthbert | ................... 165/142 |
| 1,879,582 A | * 9/1932 | Stout | ........................ 261/79.2 |
| 3,074,786 A | * 1/1963 | Duthie | ................... 366/165.2 |
| 4,087,862 A | * 5/1978 | Tsien | ........................ 366/165.1 |
| 5,059,357 A | 10/1991 | Wolf et al. | |
| 5,372,754 A | 12/1994 | Ono | |
| 5,776,254 A | 7/1998 | Yuuki et al. | |
| 5,887,117 A | 3/1999 | Desu et al. | |
| 6,074,487 A | 6/2000 | Yoshioka et al. | |
| 6,110,283 A | 8/2000 | Yamamuka et al. | |
| 6,155,540 A | 12/2000 | Takamatsu et al. | |
| 6,273,957 B1 | 8/2001 | Yamamuka et al. | |
| 6,282,368 B1 | 8/2001 | Horie et al. | |
| 6,349,887 B1 | 2/2002 | Pyo | |

FOREIGN PATENT DOCUMENTS

GB        2 096 911 A      10/2002

* cited by examiner

*Primary Examiner*—Joseph Drodge
(74) *Attorney, Agent, or Firm*—Okamoto & Benedicto LLP

(57) ABSTRACT

In one embodiment, a mixing device includes a nozzle that is disposed tangent to a wall of a chamber. Gas flowing from the nozzle rotates in the chamber forming a vortex. Another gas may be flown near a middle portion of the chamber, thereby uniformly mixing the two gases. In another embodiment, an evaporation and mixing device includes a nozzle configured to impart rotation to a gas flowing into a chamber. An injector flows a liquid material near a middle portion of the chamber, thereby mixing the gas and the liquid material. A heater may be employed to help evaporate the liquid material.

19 Claims, 9 Drawing Sheets

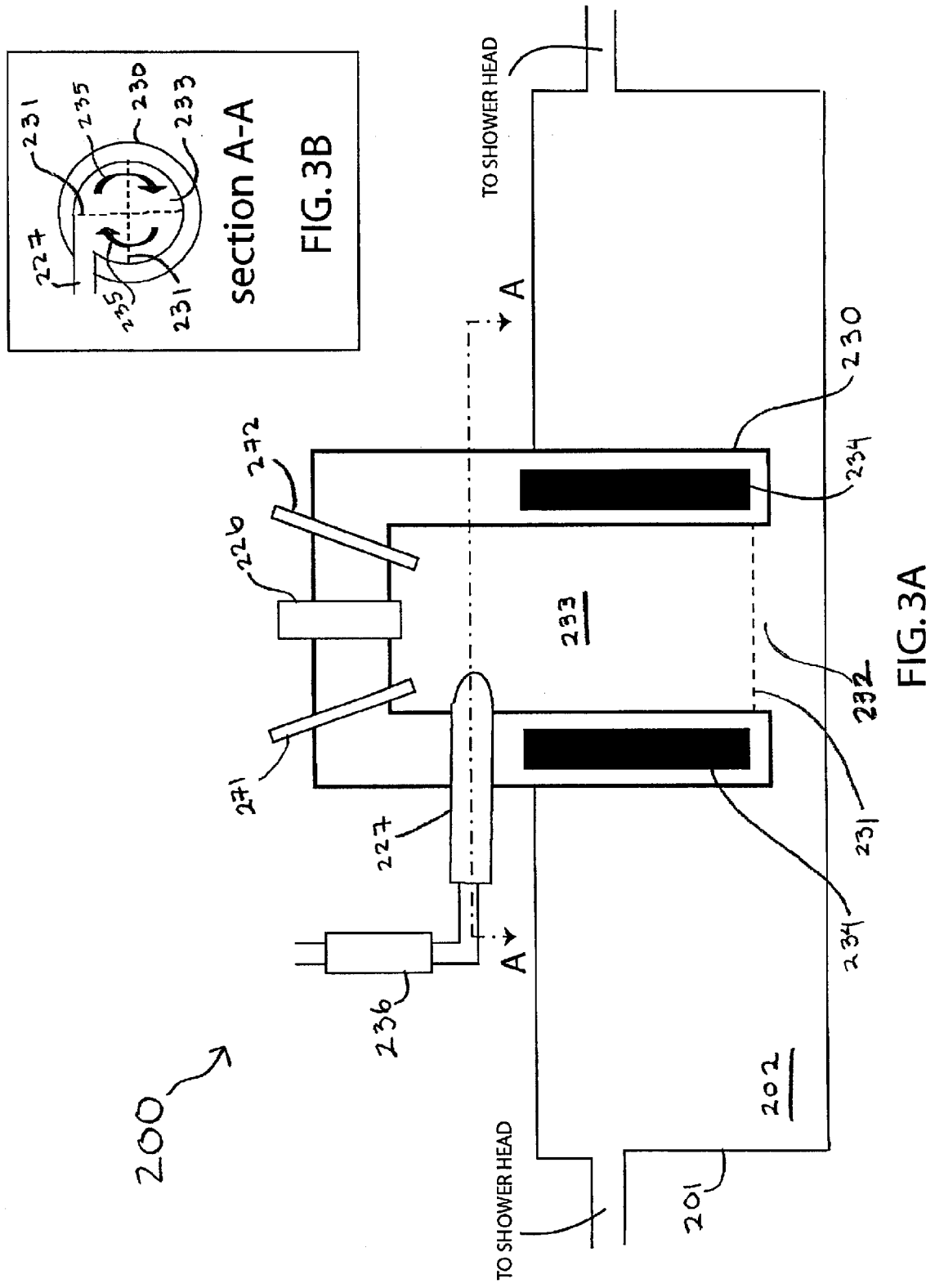

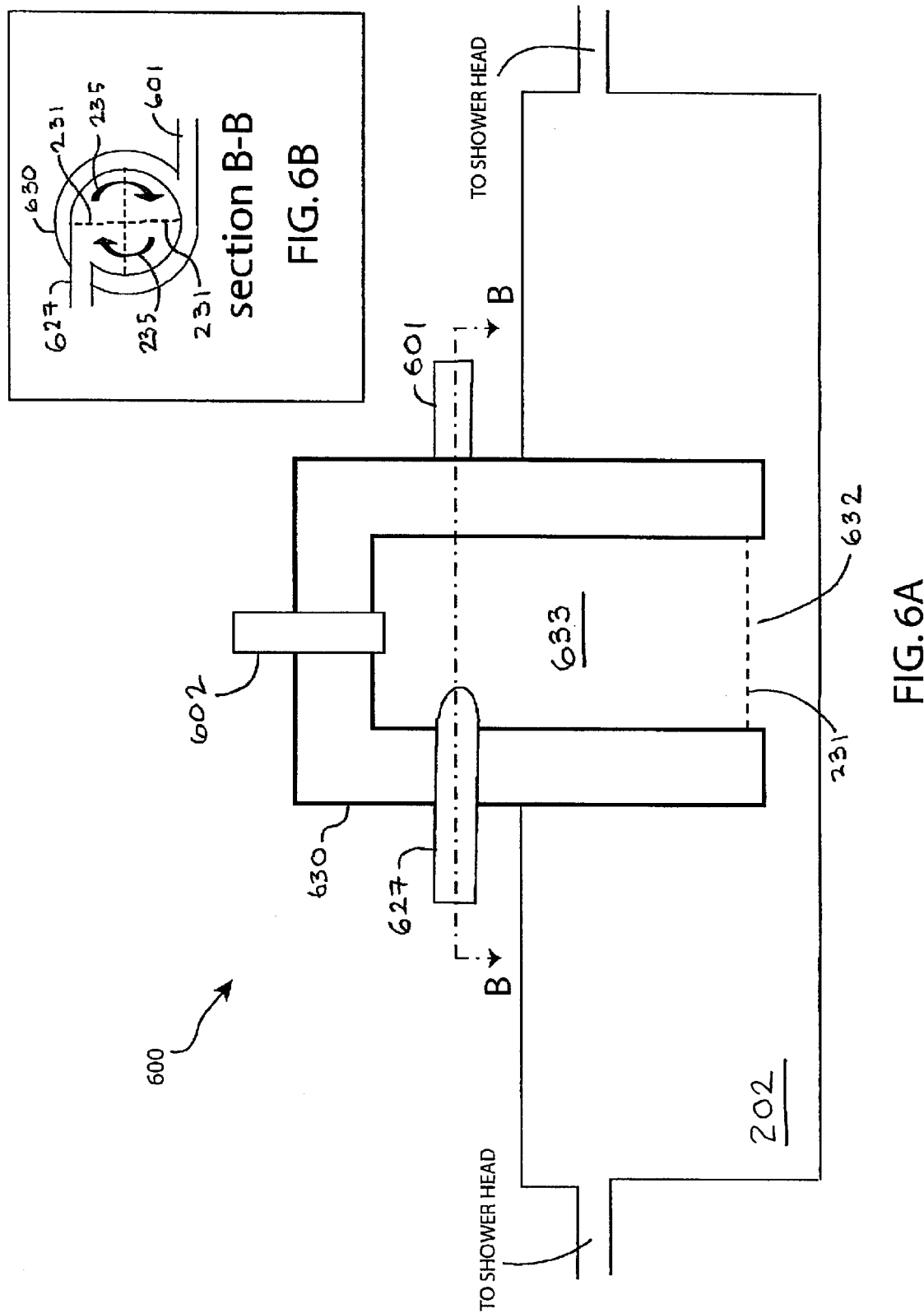

MIXING OF MATERIALS IN AN INTEGRATED CIRCUIT MANUFACTURING EQUIPMENT

REFERENCE TO RELATED APPLICATION

This application is related to commonly-assigned U.S. application Ser. No. 10/105,134, entitled "EVAPORAPORATION AND MIXING APPARATUS FOR INTEGRATED CIRCUIT MANUFACTURING EQUIPMENT," filed by Peter Krotov, Colin F. Smith, Randy Hall, and Sooyun Joh on Mar. 22, 2002. The just mentioned U.S. Application is incorporated herein by reference in its entirety.

BACKGROUND OF THE INVENTION

1. Field of the Invention

The present invention relates generally to integrated circuit fabrication, and more particularly to integrated circuit manufacturing equipment.

2. Description of the Background Art

Fabrication of an integrated circuit (IC) involves deposition of one or more layers of thin film on a wafer. For example, a dielectric material may be deposited on a wafer using a chemical vapor deposition (CVD) process. A deposition process may be performed using specialized manufacturing equipment. Typically, such an equipment includes a process chamber where a wafer is placed, and a mechanism for flowing materials into the process chamber. Depending on the process, the materials may need to be evaporated and mixed together prior to being flown into the process chamber.

FIG. 1A shows a top perspective view of a mechanism for introducing materials in an integrated circuit manufacturing equipment. As shown in FIG. 1A, a manifold 101 includes sections of metal tubing having a gas inlet 102 for receiving gaseous materials and a liquid injection point 103 for receiving liquid materials. A tubular silicon rubber heater 104 is wrapped around manifold 101 to facilitate evaporation of liquid materials. A section 105 of manifold 101 feeds into a top portion of a distributor 106, while a section 107 feeds into a bottom portion of distributor 106. From distributor 106, materials flow into plumbing lines 108 (i.e., 108A, 108B, 108C, 108D, 108E, and 108F) and into a process chamber located below distributor 106.

FIG. 1B shows a schematic diagram of the mechanism of FIG. 1A. Heater 104 is depicted in FIG. 1B as having sections 104A, 104B, and 104C. As shown in FIG. 1B, a plumbing line 108 is coupled to a shower head 121 directly overhead a wafer 122. Shower head 121 includes several holes through which materials are flown into a process chamber 120. Materials in process chamber 120 deposit on a wafer 122.

A problem with prior mechanisms for introducing materials in an integrated circuit manufacturing equipment is that they may clog if not properly maintained. Another problem with some of these mechanisms is that they do not optimally evaporate and mix materials.

SUMMARY

The present invention relates to methods and apparatus for introducing materials in an integrated circuit manufacturing equipment. In one embodiment, a mixing device includes a nozzle that is disposed tangent to a wall of a chamber. Gas flowing from the nozzle rotates in the chamber forming a vortex. Another gas may be flown near a middle portion of the chamber, thereby uniformly mixing the two gases.

In another embodiment, an evaporation and mixing device includes a nozzle configured to impart rotation to a gas flowing into a chamber. An injector flows a liquid material near a middle portion of the chamber, thereby mixing the gas and the liquid material. A heater may be employed to help evaporate the liquid material.

These and other features of the present invention will be readily apparent to persons of ordinary skill in the art upon reading the entirety of this disclosure, which includes the accompanying drawings and claims.

DESCRIPTION OF THE DRAWINGS

FIG. 3A shows a schematic diagram of the mechanism of FIGS. 2A–2D.

FIG. 3B shows a cross-sectional view of the mechanism of FIG. 3A.

FIG. 6A shows a schematic diagram of a mechanism for introducing materials in an integrated circuit manufacturing equipment in accordance with an embodiment of the present invention.

FIG. 6B shows a cross-sectional view of the mechanism of FIG. 6A

The use of the same reference label in different drawings indicates the same or like components. Drawings are not to scale unless otherwise noted.

DETAILED DESCRIPTION

In the present disclosure, numerous specific details are provided, such as examples of apparatus, components, dimensions, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1A:
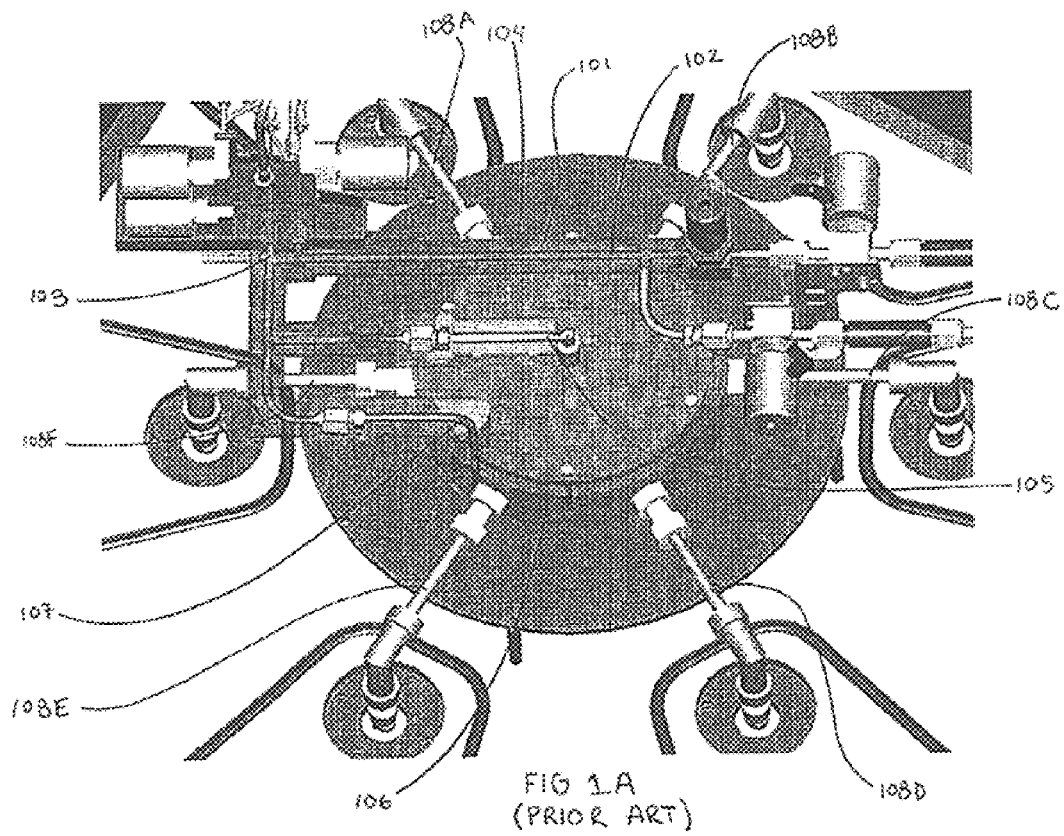
FIG. 1A shows a top perspective view of a mechanism for introducing materials in an integrated circuit manufacturing equipment in the prior art.
Figure 1B:
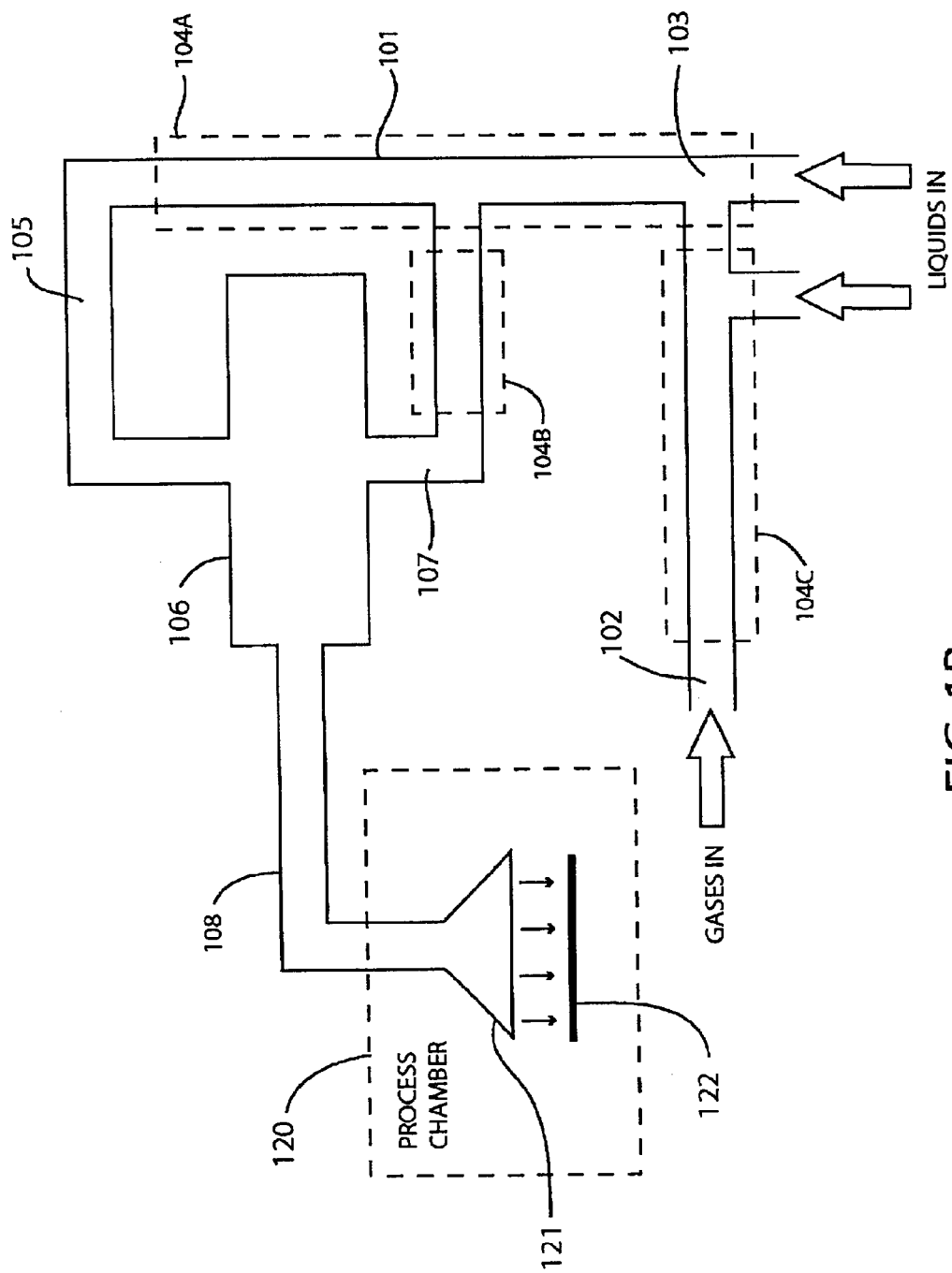
FIG. 1B shows a schematic diagram of the mechanism of FIG. 1A.
Figure 2A:
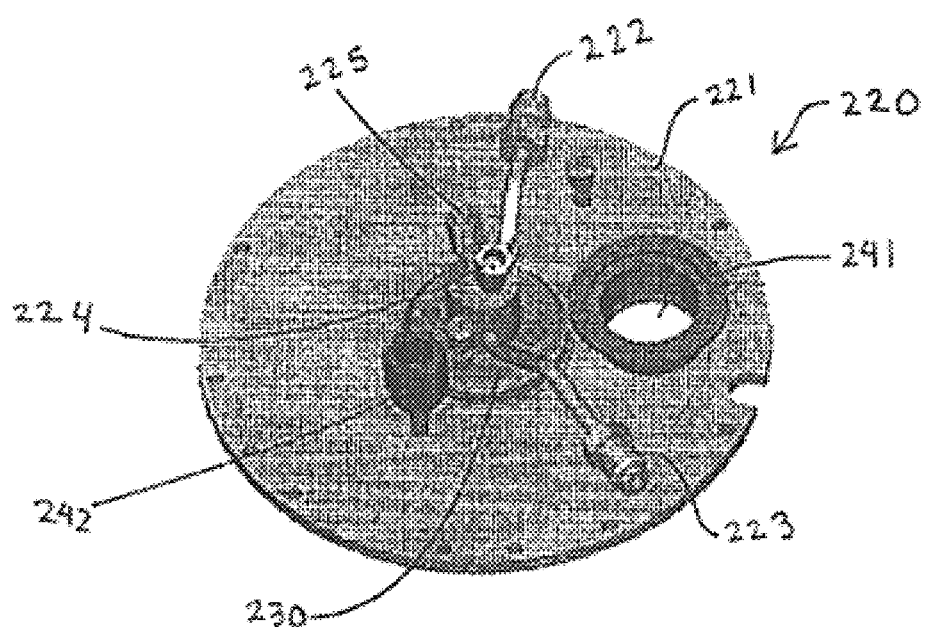
FIGS. 2A–2D show various views of a mechanism for introducing materials in an integrated circuit manufacturing equipment in accordance with an embodiment of the present invention.
Figure 2B:
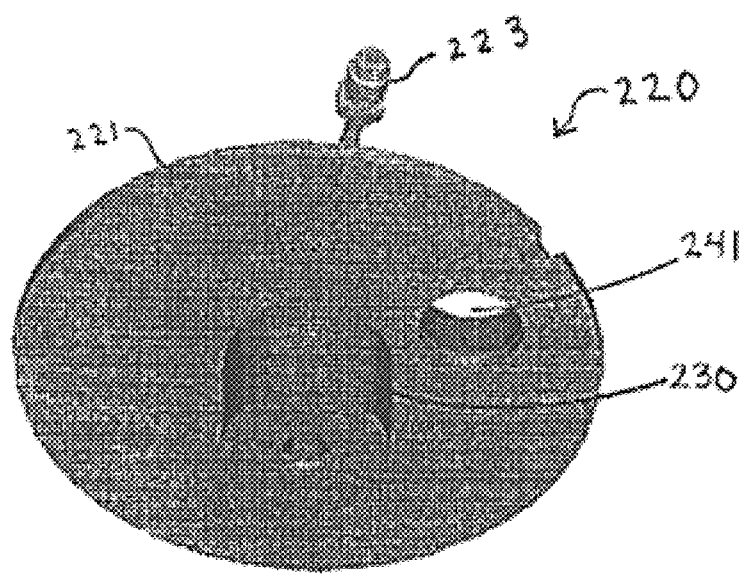

Embodiments of the present invention are now discussed beginning with FIGS. 2A and 2B. FIGS. 2A and 2B show a top perspective view and a bottom perspective view, respectively, of a top plate assembly 220 in accordance with an embodiment of the present invention. Top plate assembly 220 includes a top plate 221, which may sit on top of a distributor 201 (see FIGS. 2C and 2D) to form a mechanism 200 for introducing materials in an integrated circuit manufacturing equipment. As shown in FIG. 2A, top plate assembly 220 further includes inlet ports 222 and 223, injection ports 224 and 225, and an evaporation and mixing device (EMD) 230. As will be apparent later on below, EMD 230 may be employed for mixing, evaporation, or both.

Inlet port 222 may be coupled to a reservoir (e.g., gas cylinder) containing gas to be introduced to a process chamber. Similarly, inlet port 223 may be coupled to another gas reservoir. Inlet ports 222 and 223 feed into EMD 230.

Injection port 224 accepts liquid to be introduced to the process chamber. Similarly, injection port 225 accepts another liquid. In one embodiment, injection ports 224 and 225 each has its own separate liquid injector coupled to a reservoir (e.g., liquid tank). Injection ports 224 and 225 also feed into EMD 230.

Figure 2C:
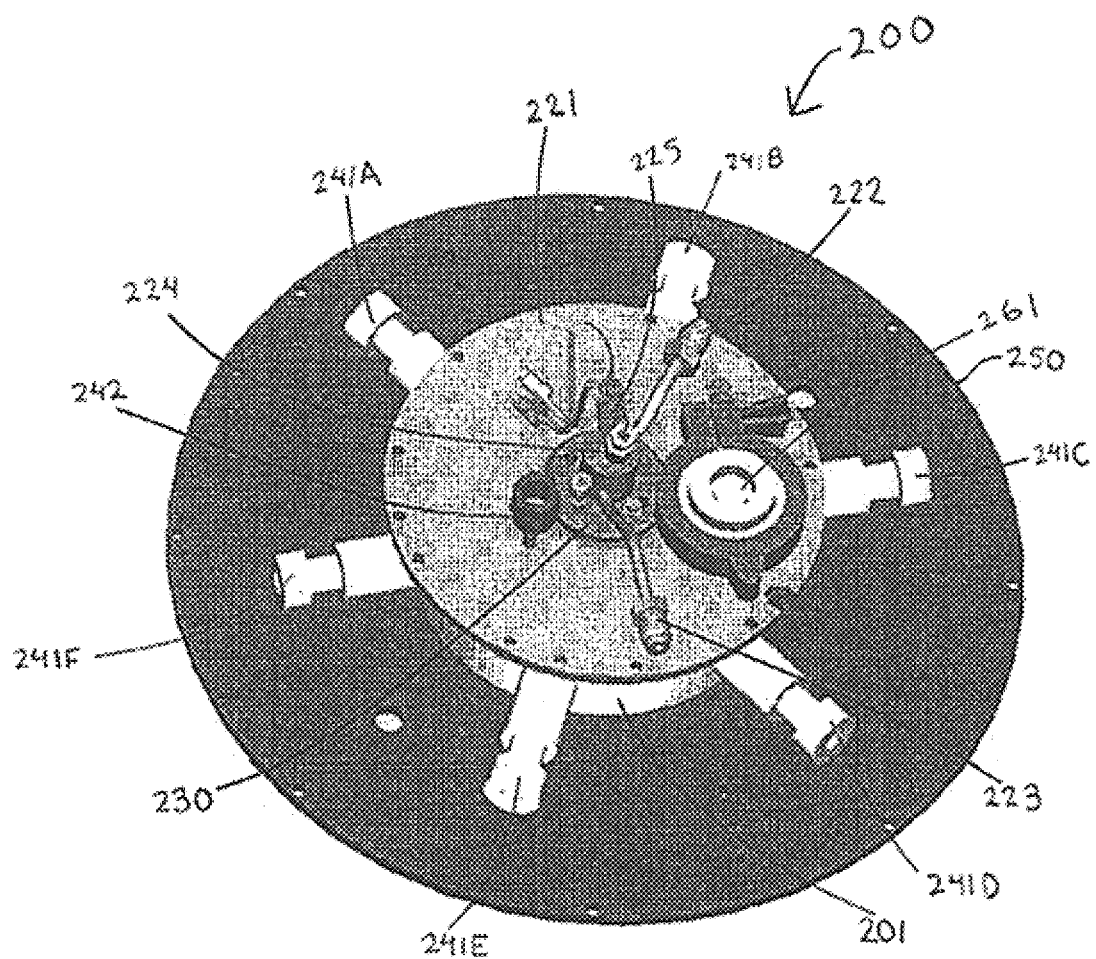

Optionally, top plate 221 may include a port 241 for accepting a viewing window (e.g., viewing window 261 shown in FIG. 2C). The viewing window allows an operator to look inside a distributor 201 located below top plate 221. Top plate 221 may also include a port 242 for accepting a pressure measuring device such as a manometer for monitoring the pressure inside distributor 201. The pressure monitoring device may include a display for visual monitoring or an electrical signal output that can be coupled to a data acquisition system.

FIG. 2C shows a top perspective view of a mechanism 200 for introducing materials in an integrated circuit manufacturing equipment in accordance with an embodiment of the present invention. Mechanism 200 may sit on top of an upper plate 250. Upper plate 250, in turn, may sit on top of a process chamber (not shown) containing one or more wafers to be processed. As shown in FIG. 2C, distributor 201 includes one or more outlet ports 241 (i.e., 241A, 241B, 241C, 241D, 241E, 241F) that may be coupled to shower heads (not shown) extending into the process chamber. In operation, materials separately introduced into inlet port 222, inlet port 223, injection port 224, and injection port 225 flow into EMD 230, into distributor 201, into an outlet port 241, into a shower head, and then into the process chamber. In one embodiment, the process chamber is configured for chemical vapor deposition.

Note that embodiments of the present invention may be used in a multi-wafer process chamber having more than one shower head or in a single wafer process chamber having a single shower head. Additionally, in the present disclosure, "shower head" refers to any type of component through which material may be flown into a process chamber, while "process chamber" refers to any type of enclosure wherein a wafer or a workpiece may be processed.

Figure 2D:
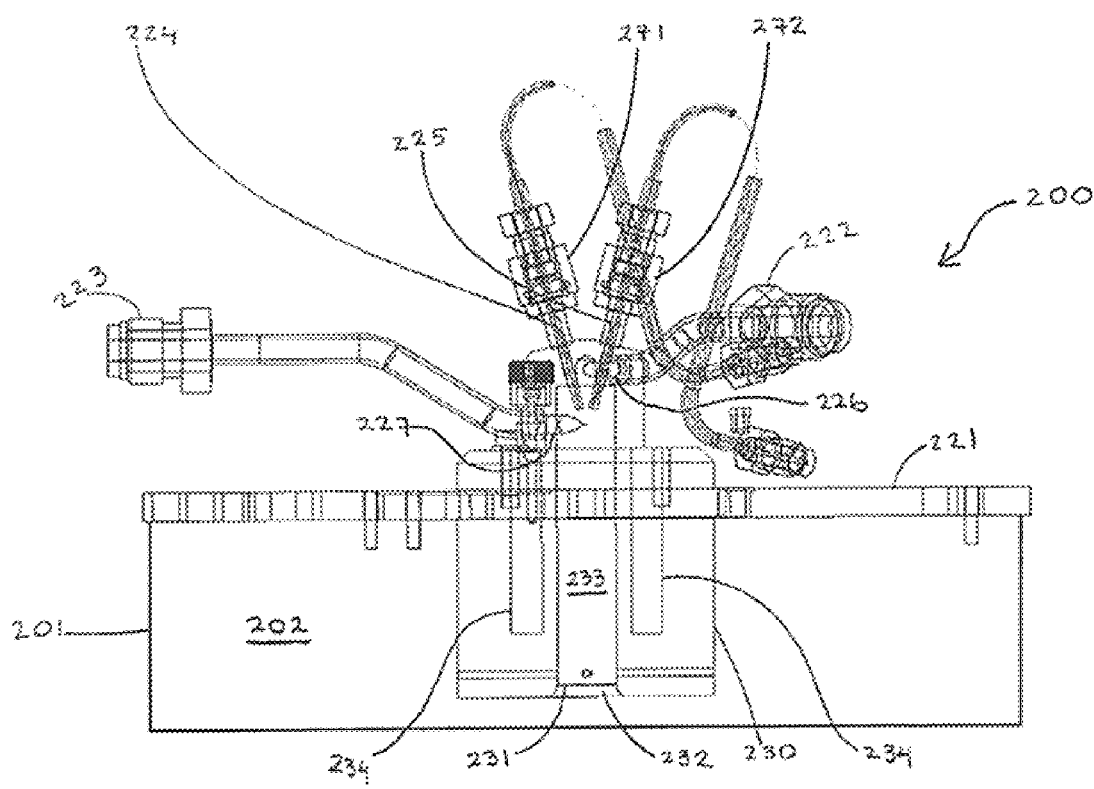

FIG. 2D shows a side x-ray view of mechanism 200. As shown in FIG. 2D, portions of EMD 230 may extend into a distribution chamber 202 of distributor 201. Partially inserting EMD 230 into distribution chamber 202 reduces the possibility of condensation of materials inside EMD 230 due to heat transfer between a non-heated EMD 230 and a heated distribution chamber 202. It should be understood, however, that EMD 230 may also be external to distributor 201. For example, EMD 230 may be located such that only its opening 232 extends into the top portion of distribution chamber 202. Note that in some embodiments, EMD 230 may be heated, while distributor 201 may be non-heated. In one embodiment, a chamber 233 of EMD 230 has a diameter of about 0.5 inch, while distribution chamber 202 has a diameter of about 7 inches.

In one embodiment, chamber 233 has a cylindrical shape. However, chamber 233 may also have different shapes. For example, chamber 233 may be conical with the wider end pointing down, conical on top and cylindrical on the bottom, etc. A shape with a wider end on the bottom advantageously helps compensate for the increasing volume of liquid materials as they change from liquid to gaseous state while moving down towards the bottom of chamber 233.

As shown in FIG. 2D, EMD 230 may have a vertical orientation with ports on the top and opening 232 on the bottom. This advantageously helps prevent accumulation of liquid materials inside chamber 233 and also reduces the possibility of clogging chamber 233. Additionally, the orientation of nozzles 226 and 227 relative to injectors 271 and 272 help prevent liquid materials from getting into and clogging nozzles 226 and 227 in the event there is no gas flow.

Still referring to FIG. 2D, gas flown into inlet port 222 enters chamber 233 via a nozzle 226, while gas flown into inlet port 223 enters chamber 233 via a nozzle 227. In one embodiment, nozzle 226 has a diameter of about 0.12 inch while nozzle 227 has a diameter of about 0.16 inch.

Liquid flown into injection port 224 enters chamber 233 via injector 271. Similarly, liquid flown into injection port 225 enters chamber 233 via injector 272. In one embodiment, injectors 271 and 272 are made of capillary tubing. As shown in FIG. 2D, EMD 230 may also have an embedded heater 234 for heating and evaporating liquids in chamber 233. Distribution chamber 202 may also be heated depending on the application.

Providing each material a separate path to chamber 233 helps minimize unwanted reactions between materials. Oftentimes, as in prior techniques, these unwanted reactions result in clogged manifolds, particulate generation, and process degradation. To alleviate the aforementioned problems, embodiments of the present invention keep the materials separate prior to mixing, which in some embodiments occur in chamber 233. Thus, materials may be provided separate flow paths to nozzle 226, nozzle 227, injector 271, and injector 272.

In one embodiment, the gaseous and liquid materials flown into EMD 230 are precursor materials for a chemical vapor deposition process. Examples of precursor materials include TOMCATS™ silicon source (Tetramethylcyclotetrasiloxane; available from Schumacher/Air Products And Chemicals, Inc.), $NH_3$, $SiH_4$, $N_2O$ etc. It should be understood, however, that the present invention is not so limited and may also be used with other types of materials in other types of processes.

FIG. 3A shows a schematic diagram further illustrating mechanism 200. Inside chamber 233, liquid materials injected by injectors 271 and 272 are evaporated and mixed with gases from nozzles 226 and 227. The resulting mixture flows out of chamber 233 and into distribution chamber 202. From distribution chamber 202, the mixture then flows to one or more shower heads in a process chamber.

FIG. 3B shows a cross-sectional view of EMD 230 taken at section A—A of FIG. 3A. Referring to FIG. 3B, nozzle 227 may be disposed such that it is tangent to the inner surface of chamber 233. Depending on the application, additional nozzles may be disposed tangent to the inner surface of chamber 233. In operation, gas from nozzle 227 circulates around chamber 233 creating a high speed rotating vortex, which is represented by arrows 235. As can be appreciated, the vortex promotes uniform mixing of materials in chamber 233.

As shown in FIG. 3A, nozzle 226 may be disposed such that it is co-axial with chamber 233. Gas from nozzle 226 is thus directed near a middle portion of chamber 233, which is now a low pressure region due to the vortex. Injectors 271 and 272 may also be disposed such that they inject liquid into the low pressure region. To facilitate the formation of the vortex, nozzle 227 is advantageously configured such that it flows gas at a relatively high rate compared to nozzle 226. For example, the flow rate of nozzle 227 may be between 2.5 slm (standard liters per minute) to 20 slm, whereas the flow rate of nozzle 226 may be about 1.0 slm or less.

The low pressure region created by the vortex promotes evaporation of liquid materials. As is well known, the lower the pressure, the lower the temperature required to evaporate a liquid. Thus, compared to prior techniques, EMD 230 may evaporate liquid materials at relatively low temperatures. Also, the relatively low temperature and pressure in chamber 233 helps minimize unwanted reactions between materials.

Heat from heater 234 facilitate evaporation of liquid materials in chamber 233. Additionally, turbulence from the vortex helps evaporate liquid materials by atomizing and dispersing them. To further enhance the evaporation process, one of the materials may be heated prior to being introduced into chamber 233. For example, as shown in FIG. 3A, a heater 236 may be installed along the path of nozzle 227 to pre-heat the gas flowing through it.

A flow turbulizor 231 (see FIGS. 3A and 3B; also FIG. 2D) may also be employed to enhance mixing and evaporation. In one embodiment, turbulizors 231 are thin wires that run from one surface of chamber 233 to an opposing surface and disposed perpendicular to the axis of chamber 233. Turbulizors 231 may be disposed near the bottom of chamber 233, for example. This allows non-vaporized liquid droplets rotating in the vortex to be diminished as they impinge on turbulizors 231. Turbulizors 231 also increase turbulence, thereby promoting mass and heat exchange with the vortex and improving the evaporation and mixing processes.

As the mixture of materials rotates towards opening 232, the relatively cold vortex picks up heat from the inner surface of chamber 233. The mixture, in turn, is evaporated by picking up heat from the vortex. The vortex is colder than the inner surface of chamber 233 because of gas expansion and liquid evaporation in the volume of chamber 233. Heater 234 not only provides heat for evaporating liquid materials, but also prevents condensation on the inner surface of chamber 233 as it is cooled down by the heat transfer with the vortex.

Figure 4:
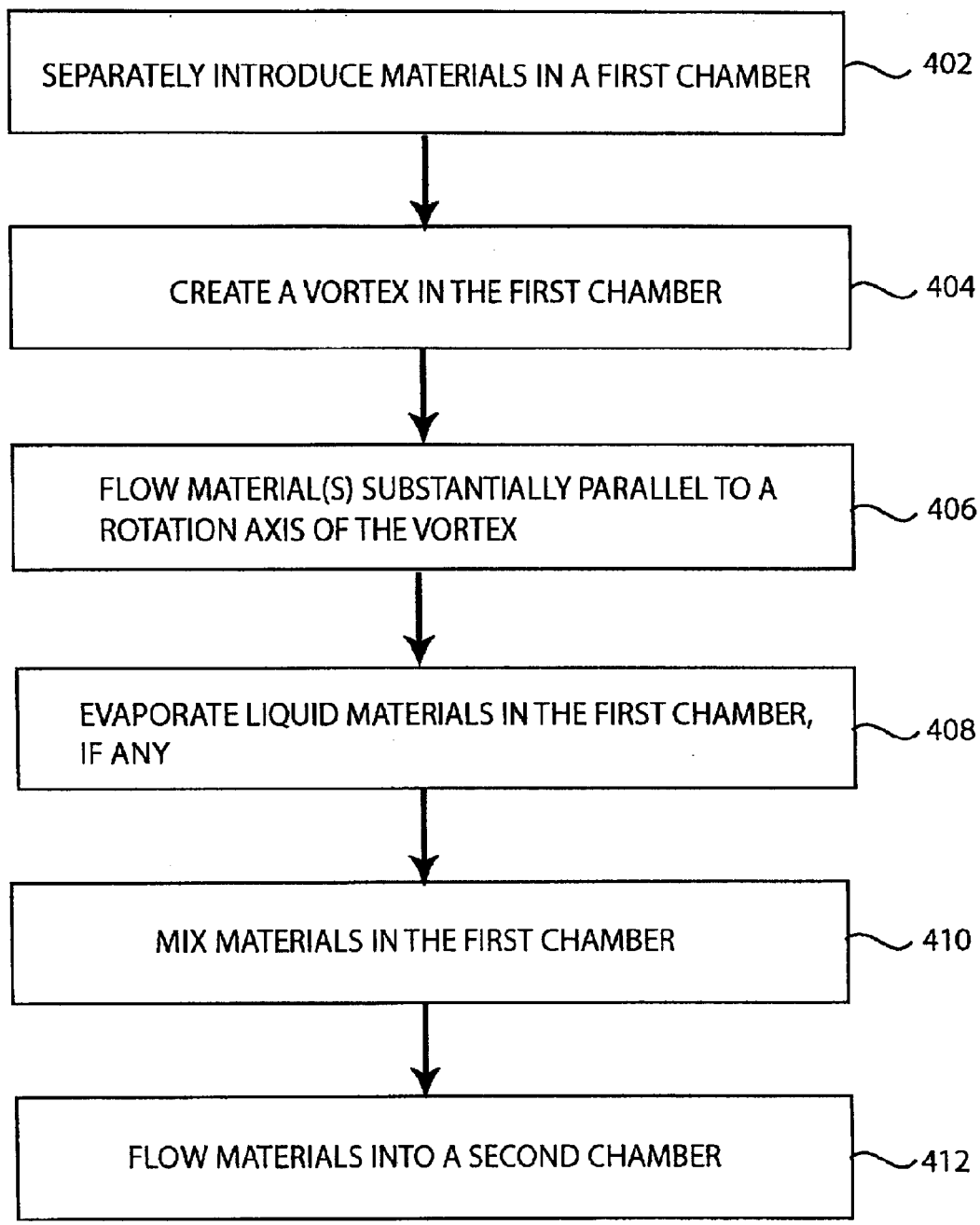
FIG. 4 shows a flow diagram of a method for introducing materials in an integrated circuit manufacturing equipment in accordance with an embodiment of the present invention.

FIG. 4 shows a flow diagram of a method for introducing materials in an integrated circuit manufacturing equipment in accordance with an embodiment of the present invention. Note that although the actions of FIG. 4 are arranged in a sequential fashion for illustration purposes, the actions may also be performed concurrently or in a different sequence.

In action 402, materials are separately introduced in a first chamber (e.g., chamber 233). Keeping the materials separate prior to mixing and evaporation advantageously minimizes clogging and unwanted reactions between materials.

In action 404, a vortex is created in the first chamber. In one embodiment, the vortex is created by flowing a gas tangent to a wall of the first chamber. The vortex generates turbulence that promotes uniform mixing of materials in the first chamber.

In action 406, materials are flown substantially parallel to the rotation axis of the vortex. For example, the materials may be flown near the a middle portion of the first chamber. As mentioned, the middle portion of the first chamber includes a low pressure region of the vortex. The low pressure promotes evaporation of liquid materials at relatively low temperatures.

In action 408, liquid materials are evaporated in the first chamber. In one embodiment, this is performed by heating the wall of the first chamber. Additionally, one of the materials may be pre-heated prior to being introduced into the first chamber. A turbulizor may also be employed to diminish non-evaporated droplets by dispersing them.

In action 410, materials in the first chamber are mixed in the vortex. Optionally, a flow turbulizor may be employed to increase turbulence in the first chamber for more uniform mixing.

In action 412, the mixture of materials is flown out of the first chamber and into a second chamber. In one embodiment, this occurs naturally as the mixture rotates down to a bottom portion of the first chamber and into the second chamber. The second chamber may be a material distribution chamber (e.g., distribution chamber 202) coupled to one or more shower heads in a process chamber. The second chamber may also be a process chamber.

Figure 5:
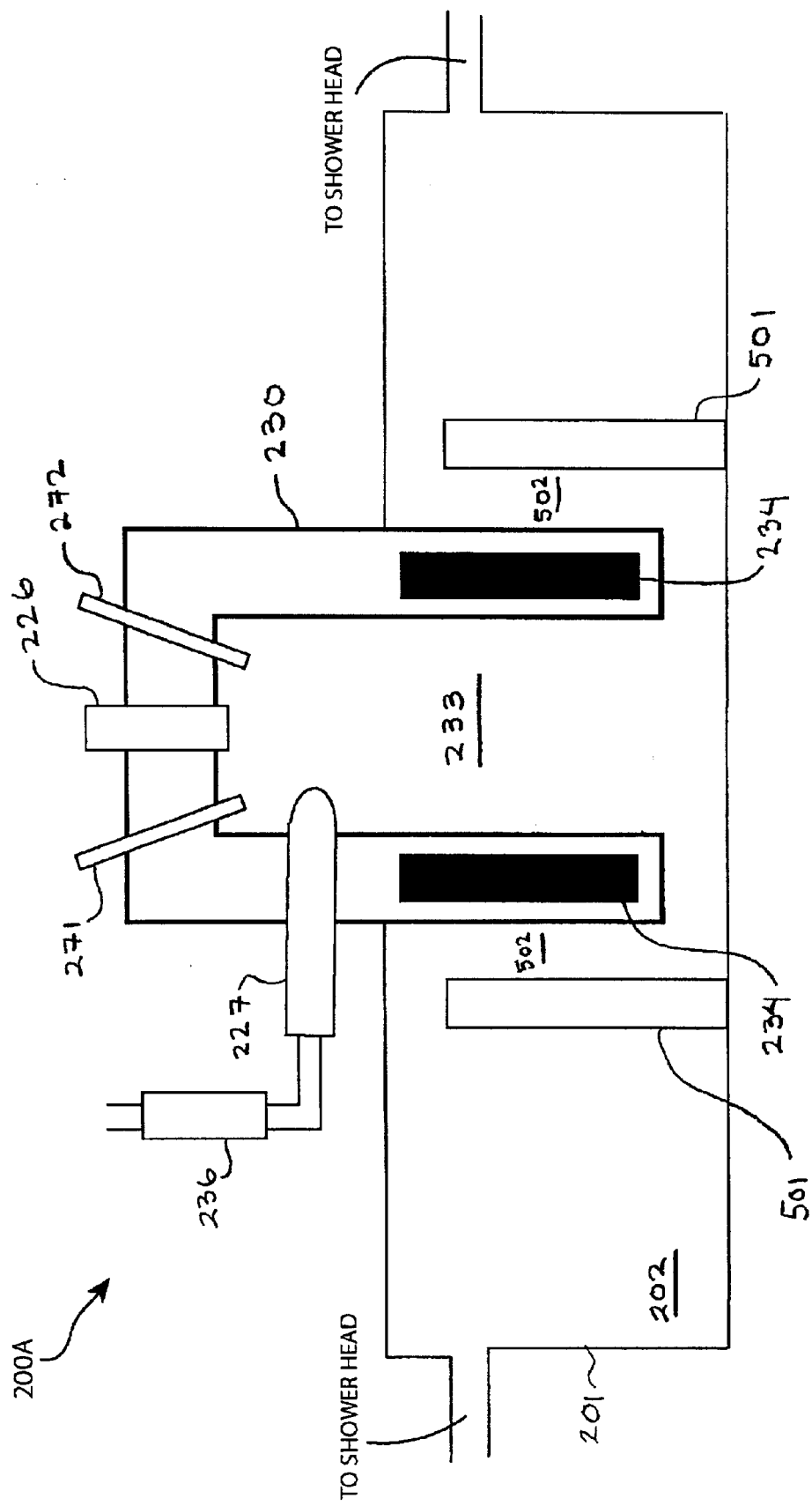
FIG. 5 shows a schematic diagram of a mechanism for introducing materials in an integrated circuit manufacturing equipment in accordance with an embodiment of the present invention.

Turning now to FIG. 5, there is shown a schematic diagram of a mechanism 200A for introducing materials in an integrated circuit manufacturing equipment in accordance with an embodiment of the present invention. Mechanism 200A is a specific embodiment of mechanism 200 previously discussed. Mechanism 200A is similar to mechanism 200 except for the addition of an enclosure 501 forming a chamber 502. In one embodiment, enclosure 501 is a cylinder that is concentric with chamber 233. Mixture from chamber 233 rotates down chamber 233 and then continues rotating up chamber 502. From chamber 502, the mixture flows out to distribution chamber 202 and into one or more shower heads in a process chamber. Heat from heater 234 helps prevent condensation in chamber 502. Note that chamber 202 may also be heated to prevent condensation in chamber 502.

Mechanism 200A may be employed in applications where additional mixing or evaporation time is required. For example, mechanism 200A may be employed when material flow into chamber 233 is too fast for adequate mixing or evaporation. In mechanism 200A, chamber 502 extends the mixing time by providing another volume for vortex flow. The mixture in chamber 233 rotates down chamber 233 and then continues rotating up chamber 502 due to remaining momentum. Additional evaporation time is also gained because the mixture is heated by the inner surface of chamber 233 as the mixture rotates down, and again heated by the outer surface (i.e., the body of vortex 230) of chamber 233 as the mixture rotates up chamber 502. The relatively larger surface area of the outer surface of chamber 233 helps in transferring more heat to the mixture, thus promoting evaporation.

Additionally, the top opening design of chamber 502 helps prevent unwanted accumulation of particulates on the bottom of distribution chamber 202. Because the mixture comes out from the top of chamber 502, the mixture tends to get flown out to the shower heads instead of settling on the bottom of distribution chamber 202.

FIG. 6A shows a schematic diagram of a mechanism 600 for introducing materials in an integrated circuit manufacturing equipment in accordance with an embodiment of the present invention. Mechanism 600 includes a mixing device 630 having a chamber 633. A nozzle 627 is disposed such that it is tangent to the inner surface of chamber 633. Optionally, a nozzle 601 disposed tangent to the inner surface of chamber 633 may also be employed. A nozzle 602 may be disposed such that it is co-axial with chamber 633.

FIG. 6B shows a cross-sectional view of mixing device 630 taken at section B—B of FIG. 6A. As shown in FIG. 6B, gas from nozzle 627 circulates around chamber 633 creating a high speed rotating vortex represented by arrows 235.

Similarly, gas from nozzle 601 may also be used to create the vortex. To facilitate the formation of the vortex, nozzle 627 (and nozzle 601, if available) is advantageously configured such that it flows gas at a relatively high rate compared to nozzle 602.

As in mechanism 200, the vortex facilitates mixing of materials in chamber 633. To further promote mixing, one or more turbulizors 231 may be disposed near opening 632 of chamber 633. Turbulizors 231 enhance the mixing action by creating more turbulence and by agitating the mixture. Also as in mechanism 200, materials are separately flown into chamber 633 to minimize unwanted reactions between them.

As can be appreciated, mechanism 600 is relatively simpler than mechanism 200 or 200A. This makes mechanism 600 a more cost-effective alternative in applications where efficient evaporation of liquid materials is not required. For example, mechanism 600 may be employed in applications where only gaseous materials are involved. Of course, a liquid material may also be introduced to chamber 633 via nozzle 602, for example.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. An apparatus for mixing materials in an integrated circuit manufacturing equipment, the apparatus comprising:
   a first chamber having a wall;
   a first nozzle tangent to the wall, the first nozzle being configured to introduce a gas into the first chamber such that the gas rotates to the bottom of the first chamber;
   a second nozzle disposed to introduce a material near a middle portion of the first chamber; and
   a second chamber, at least a portion of the first chamber being inserted in the second chamber, the second chamber being configured to distribute a mixture including at least the material from the second nozzle to a process chamber in the integrated circuit manufacturing equipment.

2. The apparatus of claim 1 wherein the material introduced by the second nozzle includes a gaseous material.

3. The apparatus of claim 1 further comprising:
   a flow turbulizor for increasing turbulence in the first chamber.

4. The apparatus of claim 1 further comprising:
   a shower head coupled between the second chamber and the process chamber.

5. The apparatus of claim 4 wherein the process chamber is configured for chemical vapor deposition.

6. The apparatus of claim 1 further comprising:
   a third nozzle tangent to the wall, the third nozzle being configured to introduce another gas into the first chamber.

7. The apparatus of claim 1 wherein the first nozzle and the second nozzle have separate material flow paths.

8. A method of mixing materials in an integrated circuit manufacturing equipment, the method comprising:
   creating a rotating vortex with a first gas in a first chamber;
   flowing a second gas near a center portion of the vortex; and
   flowing a mixture including at least the first gas and the second gas to a second chamber that encloses at least a portion of the first chamber and is arranged to continue the rotation created in the first chamber.

9. The method of claim 8 further comprising:
   flowing a third gas tangent to a wall of the first chamber.

10. The method of claim 9 further comprising:
    flowing a mixture including at least the first gas, the second gas, and the third gas to a process chamber.

11. The method of claim 8 further comprising:
    flowing the mixture from the second chamber to a process chamber.

12. The method of claim 11 wherein the process chamber is configured for chemical vapor deposition.

13. The method of claim 8 wherein the first gas and the second gas are separately introduced into the first chamber.

14. An apparatus for mixing materials comprising:
    means for creating a rotating vortex in a first chamber with a first gas, at least a portion of the first chamber being inserted in a second chamber arranged to continue the rotation created in the first chamber; and
    means for flowing a second gas near a middle portion of the first chamber.

15. The apparatus of claim 14 wherein the second chamber comprises a material distribution chamber.

16. The apparatus of claim 14 further comprising:
    means for delivering a mixture including at least the first gas and the second gas into a process chamber.

17. The apparatus of claim 14 further comprising:
    means for agitating a mixture including at least the first gas and the second gas in the first chamber.

18. An apparatus for mixing materials in an integrated circuit manufacturing equipment, the apparatus comprising:
    a first chamber having a wall;
    a first nozzle tangent to the wall, the first nozzle being configured to introduce gas into the first chamber such that the gas rotates to the bottom of the first chamber;
    a second nozzle disposed to introduce material near a middle portion of the first chamber; and
    a flow turbulizor for increasing turbulence in the first chamber, the flow turbulizor including a piece of wire.

19. A method of mixing materials in an integrated circuit manufacturing equipment, the method comprising:
    creating a vortex with a first gas in a first chamber;
    flowing a second gas near a center portion of the vortex;
    flowing a mixture including at least the first gas and the second gas to a second chamber; and
    agitating the mixture with a piece of wire disposed in the first chamber.

* * * * *